US012666640B2

(12) United States Patent     (10) Patent No.:   US 12,666,640 B2

Shen et al.     (45) Date of Patent:    Jun. 23, 2026

(54) LOW-FREQUENCY NOSIE TRANSISTORS WITH CURVED CHANNELS

(71) Applicant: Taiwan Semiconductor Manufacturing Company, Ltd., Hsinchu (TW)

(72) Inventors: Wen-Chao Shen, Hsinchu (TW); Shih-Chang Chen, Chiayi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 551 days.

(21) Appl. No.: 18/171,362

(22) Filed: Feb. 19, 2023

(65) Prior Publication Data

US 2024/0088289 A1     Mar. 14, 2024

Related U.S. Application Data

(60) Provisional application No. 63/375,533, filed on Sep. 13, 2022.

(51) Int. Cl.
    *H10D 30/60*     (2025.01)
    *H10D 30/01*     (2025.01)
    (Continued)

(52) U.S. Cl.
    CPC ......... *H10D 30/611* (2025.01); *H10D 30/023* (2025.01); *H10D 30/024* (2025.01); *H10D 30/62* (2025.01); *H10D 64/518* (2025.01)

(58) Field of Classification Search
    CPC .. H10D 30/023; H10D 30/024; H10D 30/611; H10D 30/62; H10D 84/0158; H10D 84/0193; H10D 84/834; H10D 64/518
    See application file for complete search history.

(56) References Cited

U.S. PATENT DOCUMENTS 9,818,875 B1 * 11/2017 Bi .......................... H10D 30/62
2011/0068401 A1 * 3/2011 Izumida ............... H10D 84/038
                                                257/E27.111

(Continued)

FOREIGN PATENT DOCUMENTS

TW        201624640 A     7/2016
TW        201705297 A     2/2017
           (Continued)

OTHER PUBLICATIONS

First office action received in the counterpart Taiwan application 112126451, mailed on Apr. 8, 2024.

(Continued)

*Primary Examiner* — Tuan A Hoang

(74) *Attorney, Agent, or Firm* — Kilpatrick Townsend & Stockton LLP

(57)          ABSTRACT

A transistor includes: a substrate; a first fin and a second fin protruding upwardly from a top surface of the substrate, wherein the first fin and the second fin are concentric, and each of the first fin and the second fin comprises a first straight section, a second straight section in parallel with the first straight section, a first curved section, and a second curved section; a first drain and a second drain; a first source and a second source; a first curved channel and a second curved channel located at the first curved section of the first fin and the first curved section of the second fin, respectively; and a third curved channel and a fourth curved channel located at the second curved section of the first fin and the second curved section of the second fin, respectively.

19 Claims, 14 Drawing Sheets

(51) Int. Cl.
    *H10D 30/62*       (2025.01)
    *H10D 64/27*       (2025.01)

(56)             References Cited

U.S. PATENT DOCUMENTS

| | | |
|---|---|---|
| 2012/0168868 A1 | 7/2012 | Chiu et al. |
| 2013/0221491 A1* | 8/2013 | Wann .................... H10D 62/10 |
| | | 257/E21.409 |
| 2015/0255593 A1* | 9/2015 | Yu ...................... H10D 30/0243 |
| | | 257/401 |
| 2017/0020078 A1 | 1/2017 | Schreiner |
| 2017/0098709 A1* | 4/2017 | Dias .................... H10D 62/235 |
| 2017/0200786 A1* | 7/2017 | Zang ................... H10D 62/126 |
| 2018/0010873 A1 | 1/2018 | Kresser |

FOREIGN PATENT DOCUMENTS

| | | |
|---|---|---|
| TW | 201721737 A | 6/2017 |
| TW | 202205675 A | 2/2022 |

OTHER PUBLICATIONS

Tang-Jung Chiu et al., "An Octagonal Dual-Gate Transistor With Enhanced and Adaptable Low-Frequency Noise", published on IEEE Electron Device Letters, vol. 32, No. 1, Jan. 2011.

\* cited by examiner

200

Form a first ground pattern

202

↓

Form a first spacer structure around the first ground pattern

204

↓

Remove the first ground pattern

206

↓

Form a second spacer structure around the first spacer structure

208

↓

Remove the first spacer structure

210

↓

Form fins by transferring the pattern of second spacer structure to a silicon layer
212

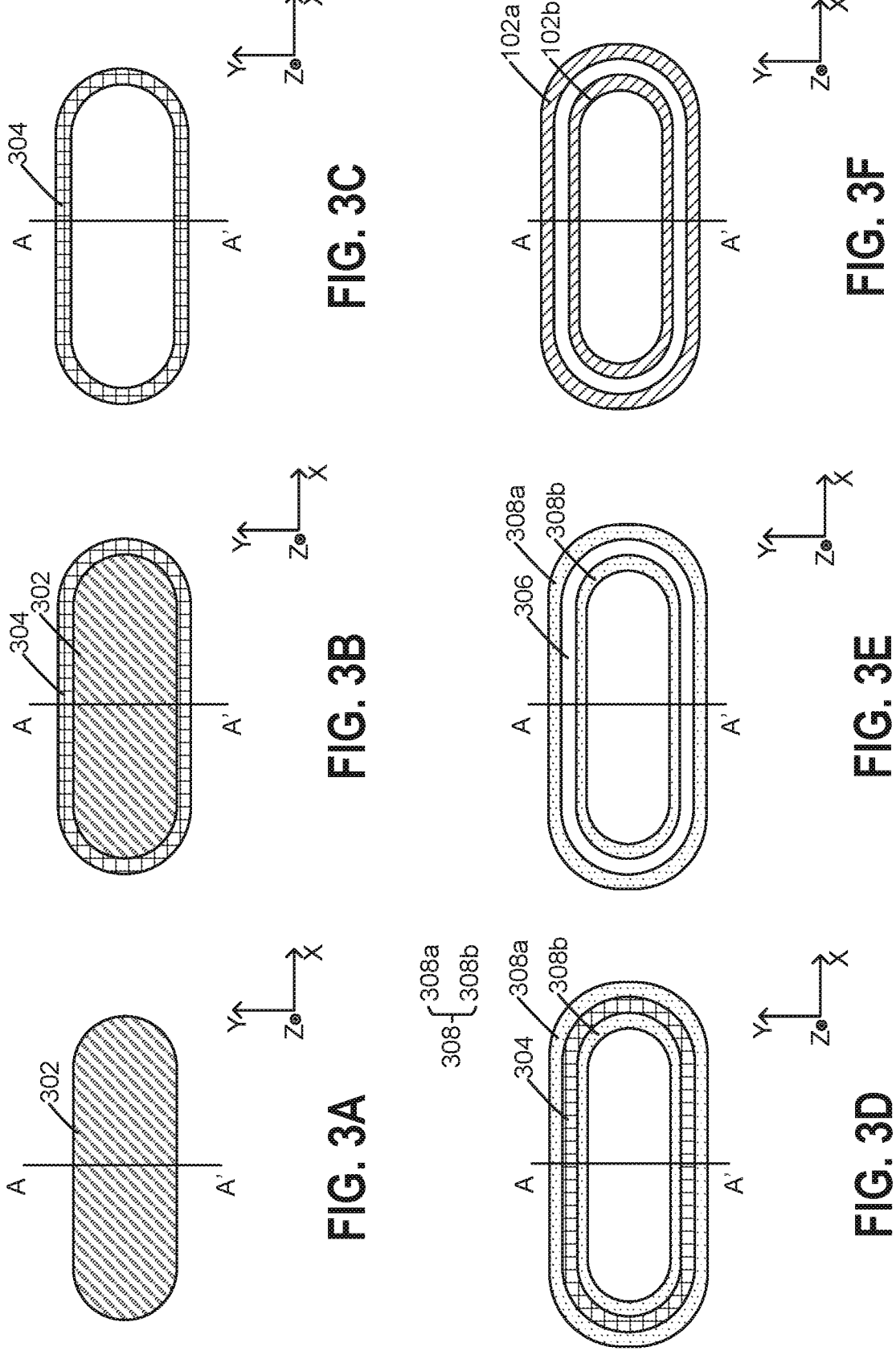

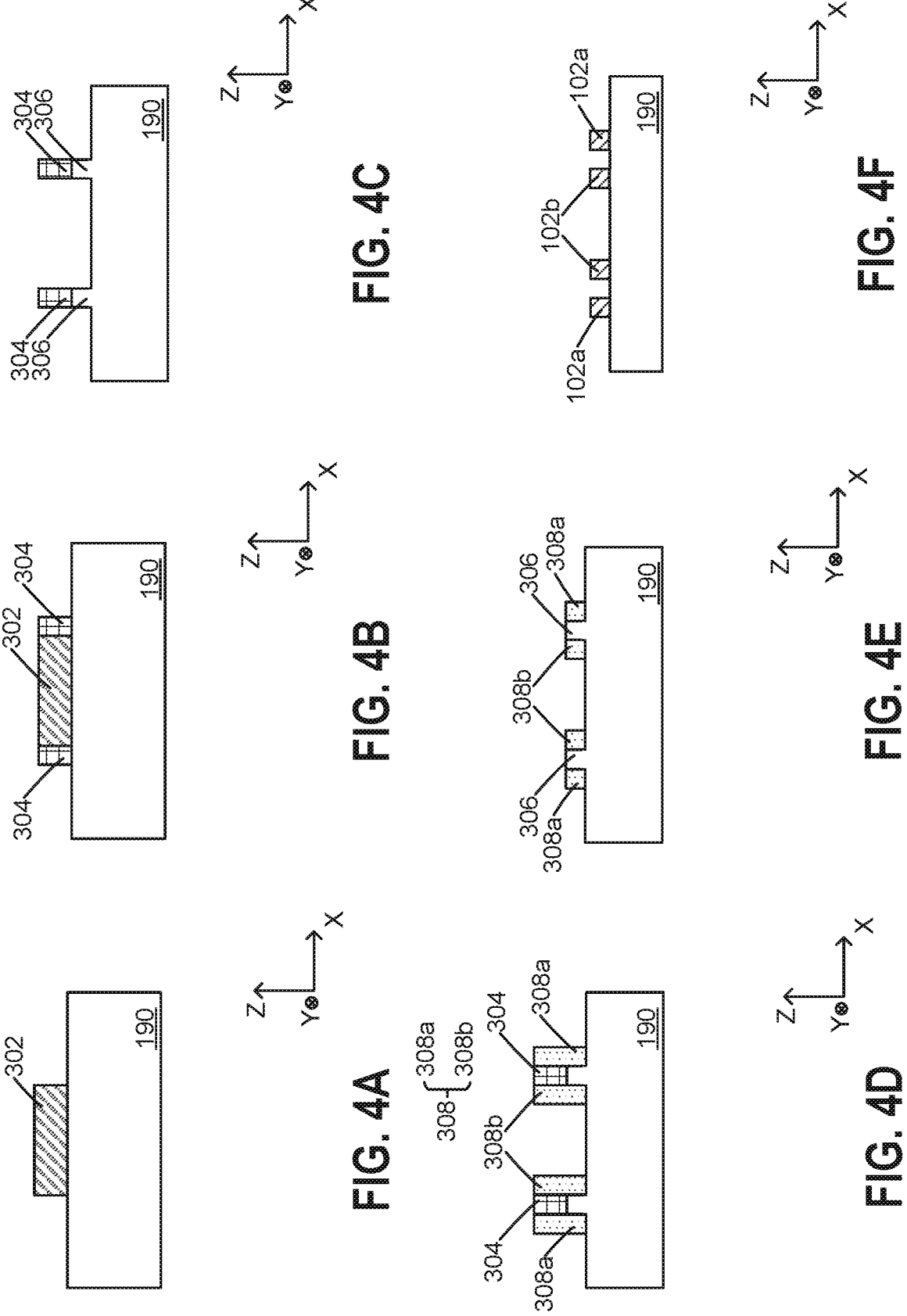

1500

LOW-FREQUENCY NOSIE TRANSISTORS WITH CURVED CHANNELS

FIELD

Embodiments of the present disclosure relate generally to semiconductor devices, and more particularly to low-frequency noise (LFN) transistors.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are top views of the structure at various stages in accordance with some embodiments.

FIGS. 4A-4F are cross-sectional views of the structure at various stages in accordance with some embodiments.

DETAILED DESCRIPTION OF THE INVENTION

Figure 1:
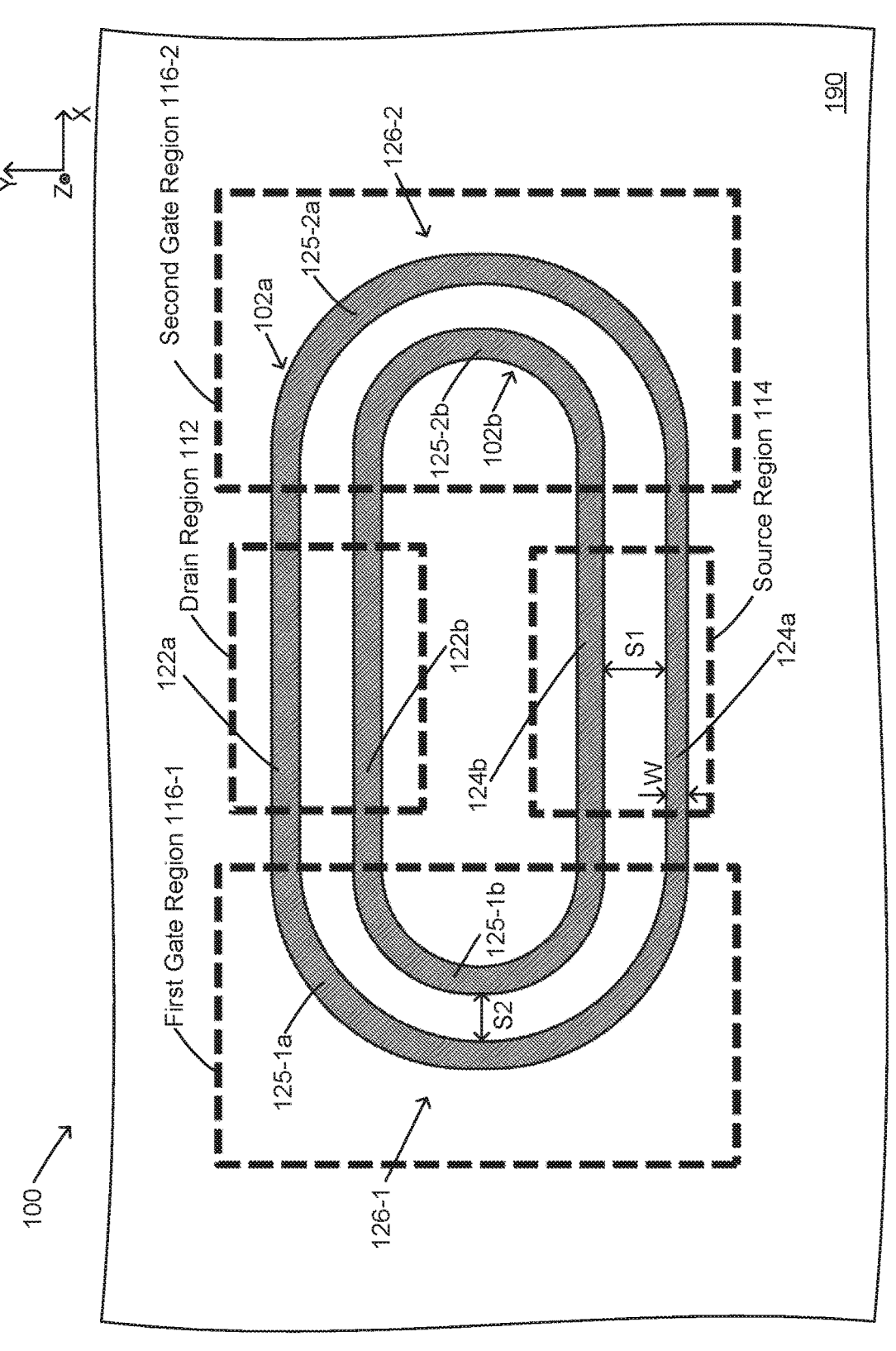
FIG. 1 is a diagram illustrating an example low-frequency noise (LFN) transistor in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

As the semiconductor technology heads towards miniaturizing the transistor size, the transistor noise increases dramatically, degrading the accuracy and the reliability of some integrated circuits. Various techniques have thus been proposed for suppressing the transistor noise.

However, the transistor noise is not always unfavorable. In some applications such as random number generators (RNGs), neuromorphic computation, perturbative learning in bio-inspired computations, data encryption, stochastic arithmetic, probabilistic modeling, transistor noise is utilized instead of being prevented from. These applications normally require multichannel uncorrelated noise in hardware implementations. While conventional noise generators are based on cellular automata, the feasibility of using transistors for their noise properties is being explored.

The low-frequency noise (LFN) is one of the transistor noise components. The low-frequency noise results from the cumulative effect of a large number of traps that are distributed inside the oxide or at the silicon-oxide interface. Conventional low-frequency noise transistors (also referred to as "LFN transistors" or "transistors with high low-frequency noise") are fabricated using complicated processes and circuit designs. Extra ion implantation processes, extra masks, and complicated oxide engineering are needed.

In accordance with some aspects of the disclosure, various LFN transistors are provided. The LFN transistors are characterized by at least one curved channel (in the form of at least one curved or non-straight fin in some embodiments). Due to the presence of the at least one curved channel, there are more traps located inside the oxide (i.e., the gate dielectric) or at the silicon-oxide interface. As a result, carriers in the at least one curved channel are more likely to be trapped or de-trapped due to these extra traps. Accordingly, the low-frequency noise generated by the LFN transistor is increased. In other words, the probability for the carriers to interact with the interface traps increases, thereby enhancing the noise level of the LFN transistor.

In addition, the non-uniformity of features of the fins that serve as channels also contributes to the low-frequency noise of an LFN transistor. The non-uniformity of the fin height, the fin width, the crystal plane, and the lattice transition are some examples. The non-uniformity contributes to more traps located inside the oxide (i.e., the gate dielectric) or at the silicon-oxide interface. As a result, carriers in the at least one curved channel are more likely to be trapped or de-trapped due to these extra traps. Accordingly, the low-frequency noise generated by the LFN transistor is increased.

Moreover, the fabrication processes of the LFN transistors are compatible with processes such as FinFET fabrication processes, and no complicated processes and circuit designs are needed. Extra ion implantation processes, extra masks, and complicated oxide engineering can be avoided as well. In addition, the LFN transistors may be simultaneously formed on the same semiconductor chip along with other circuits formed on the semiconductor chip, such as digital circuitry, analog circuitry, and mixed signal circuitry, which are also formed using the same fabrication processes such as FinFET fabrication processes.

Details of various aspects of the disclosure will be described below in detail with reference to FIGS. 1-16.

Example Low-Frequency Noise Transistors with Curved Channel(s)

FIG. 1 is a diagram illustrating an example low-frequency noise (LFN) transistor 100 in accordance with some embodiments. In the example shown in FIG. 1, the LFN transistor 100 is a FinFET. It should be noted that the techniques disclosed in the disclosure are not limited to FinFETs and may be generally applicable to other technologies such as gate-all-around field-effect transistors (GAA FETs), nanosheet transistors, two-dimensional (2D) material devices, planar metal-oxide-semiconductor field-effect transistors (MOSFETs) including the n-type and the p-type.

In the example shown in FIG. 1, the LFN transistor 100 includes, among other components, a substrate 190, two concentric fins 102*a* and 102*b* protruding upwardly from a top surface of the substrate 190 in a vertical direction (i.e., the Z-direction shown in FIG. 1), a gate structure 126-1 located in the first gate region 116-1, and a gate structure 126-2 located in the second gate region 116-2.

Each of the concentric fins 102*a* and 102*b* includes a first straight section, a second straight section in parallel with the first straight section, a first curved section, and a second curved section. The concentric fins 102*a* and 102*b* include drains 122*a* and 112*b* (collectively, 122) located in a drain region 112, sources 124*a* and 124*b* (collectively, 124) located in a source region 114, curved channels 125-1*a* and 125-1*b* located in a first gate region 116-1, and curved channels 125-2*a* and 125-2*b* located in a second gate region 116-2.

A first drain 122*a* and a second drain 122*b* are located at the first straight section of the fin 102*a* and the first straight section of the fin 102*b*, respectively. A first source 124*a* and a second source 124*b* are located at the second straight section of the fin 102*a* and the second straight section of the fin 102*b*, respectively. The first curved channel 125-1*a* and the second curved channel 125-1*b* are located at the first curved section of the fin 102*a* and the first curved section of the fin 102*b*, respectively. The third curved channel 125-2*a* and the fourth curved channel 125-2*b* are located at the second curved section of the fin 102*a* and the second curved section of the fin 102*b*, respectively.

The LFN transistor 100 has a double-gate configuration, and two pairs of curved channels 125-1*a*, 125-1*b*, 125-2*a*, and 125-2*b* are located between the drains 122 and the sources 124. The first pair of curved channels 125-1*a* and 125-1*b* (collectively, 125-1) are located in the first gate region 116-1, while the second pair of curved channels 125-2*a* and 125-2*b* (collectively, 125-2) are located in the second gate region 116-2. Each of the gate structures 126-1 and 126-2 includes a gate dielectric and a gate electrode. The gate dielectrics are disposed on (e.g., in contact with three sides) the first pair of curved channels 125-1*a* and 125-1*b* and the second pair of curved channels 125-2*a* and 125-2*b*, respectively. And the gate electrodes are disposed on (e.g., in contact with three sides) the gate dielectrics, respectively. The gate structures 126-1 and 126-2 are operable to control the on and off of the first pair of curved channels 125-1*a* and 125-1*b* and the second pair of curved channels 125-2*a* and 125-2*b*, respectively.

In the example shown in FIG. 1, the concentric fins 102*a* and 102*b* are rectangles extending in a first horizontal direction (i.e., the X-direction shown in FIG. 1) with round corners. The concentric fins 102*a* and 102*b* are sometimes referred to as "paperclip-like fins." The drains 122 and the sources 124 are located at the elongated section of the concentric fins 102*a* and 102*b*. The first pair of curved channels 125-1*a* and 125-1*b* are located at the round corner sections of the concentric fins 102*a* and 102*b* on the left side, while the second pair of curved channels 125-2*a* and 125-2*b* are located at the round corner sections of the concentric fins 102*a* and 102*b* on the right side. In other words, the drains 122 and the sources 124 are located at straight sections of the concentric fins 102*a* and 102*b*, whereas the curved channels 125-1*a*, 125-1*b*, 125-2*a*, and 125-2*b* are located at non-straight or curved sections of the concentric fins 102*a* and 102*b*.

As mentioned above, the low-frequency noise results from the cumulative effect of a large number of traps that are distributed inside the oxide or at the silicon-oxide interface. Because of the presence of the curved channels 125-1*a*, 125-1*b*, 125-2*a*, and 125-2*b*, there are more traps located inside the oxide (i.e., the gate dielectric) or at the silicon-oxide interface.

Accordingly, the low-frequency noise generated by the LFN transistor 100 is increased. In other words, the probability for the carriers to interact with the interface traps increases, thereby enhancing the noise level of the LFN transistor 100.

The fin shapes and their characteristics cause the corresponding channels to define current paths which cause carriers to change direction relative to the semiconductor crystal. Accordingly, the carriers cross one or more crystal planes. Because of the incoherence between the semiconductor crystal orientation and the direction of the carrier flow, carriers in the curved channels 125-1a, 125-1b, 125-2a, and 125-2b are more likely to be trapped or de-trapped due to these extra traps. A relatively large low frequency noise is induced. In some embodiments, the LFN transistor operates according to a characteristic that the greater the incoherence between the semiconductor crystal orientation and the direction of the carrier flow, the greater the low frequency noise (e.g., 1/f noise) induced.

In the example shown in FIG. 1, the width of the concentric fins 102a and 102b is W, the spacing between the concentric fins 102a and 102b at the straight sections is S1, and the spacing between the concentric fins 102a and 102b at the round corner sections is S2. In some examples, the width of the concentric fins 102a and 102b ranges from 4 nm to 9 nm. In some examples, the spacing S1 and the spacing S2 range from 16 nm to 40 nm. In some embodiments, the spacing S1 is larger than the spacing S2. In other embodiments, the spacing S1 is smaller than the spacing S2. In some embodiments, the spacing S1 and the spacing S2 are identical.

While certain geometries of the LFN transistor 100 are shown in FIG. 1 as an example, it should be understood that other geometries can be employed as needed in various designs. For example, curved channels with other shapes and other sizes may be employed in other designs, and the operation principles thereof are similar or identical. One of ordinary skill in the art would recognize many variations, modifications, and alternatives.

Example Process Flow for Fabricating Example Concentric Fins

Figure 2:
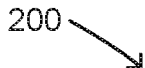
FIG. 2 is a flowchart diagram illustrating an example method for fabricating example concentric fins in accordance with some embodiments.

FIG. 2 is a flowchart diagram illustrating an example method 200 for fabricating example concentric fins in accordance with some embodiments. In the example shown in FIG. 2, the method 200 includes operations 202, 204, 206, 208, 210, and 212. Additional operations may be performed. FIGS. 3A-3F are top views of the structure at various stages in accordance with some embodiments. FIGS. 4A-4F are cross-sectional views of the structure at various stages in accordance with some embodiments. FIGS. 4A-4F are cross-sectional views of the structure taken at A-A' shown in FIGS. 3A-3F.

At operation 202, a first ground pattern is formed. In one implementation, the first ground pattern is formed by patterning and etching the (silicon) substrate. Therefore, the first ground pattern is made of the same material (e.g., silicon) as the substrate. In the example shown in FIG. 3A and FIG. 4A, the first ground pattern 302 is formed on the top of substrate 190 after etching areas of the substrate that are not covered by a photoresist. The first ground pattern 302 has a rectangular shape extending in the X-direction with round corners (e.g., four round corners). In some embodiments, the round corners are naturally formed during the etching process.

At operation 204, a first spacer structure is formed around the first ground pattern. In some implementations, the first spacer structure is formed by the blanket deposition of a spacer layer and subsequent etching. In some examples, the first spacer structure is made of silicon nitride. In other examples, the first spacer structure is made of silicon dioxide. In yet other examples, the first spacer structure is made of titanium oxide. It should be understood that the first spacer structure can be made of other suitable materials in other embodiments. In the example shown in FIG. 3B and FIG. 4B, the first spacer structure 304 is formed around the first ground pattern 302.

At operation 206, the first ground pattern is removed. In some implementations, the first ground pattern is removed by etching. The etchant used in the etching is characterized by a high etch selectivity between the first ground pattern and the first spacer structure. In the example shown in FIG. 3C and FIG. 4C, the first ground pattern 302 is removed, and the portion of the substrate 190 that is not covered by the first spacer structure 304 is etched in the Z-direction. In other words, a protrusion structure 306 is formed, and it is located under the first spacer structure 304.

At operation 208, a second spacer structure is formed around the first spacer structure. In some implementations, the second spacer structure is formed by the blanket deposition of another spacer layer and subsequent etching. In some examples, the second spacer structure is made of silicon nitride. In other examples, the second spacer structure is made of silicon dioxide. In yet other examples, the second spacer structure is made of titanium oxide. It should be understood that the spacer structure can be made of other suitable materials in other embodiments. In the example shown in FIG. 3D and FIG. 4D, the second spacer structure 308 is formed around the first spacer structure 304. The second spacer structure 308 includes two concentric components 308a (i.e., an outer component) and 308b (i.e., an inner component), located at two sides of the first spacer structure 304. It should be understood that the second spacer structure 308 has a larger height in the Z-direction than that of the first spacer structure 304 due to the presence of the protrusion structure 306.

At operation 210, the first spacer structure is removed. In some implementations, the first spacer structure is removed by etching. The etchant used in the etching is characterized by a high etch selectivity between the first spacer structure (and the second spacer structure) and the substrate. In the example shown in FIG. 3E and FIG. 4E, the first spacer structure 304 is removed, and a top portion of the second spacer structure 308 is removed (i.e., the height of the second spacer structure 308 in the Z-direction is reduced). As a result, the protrusion structure 306 is exposed.

At operation 212, fins are formed by transferring the pattern of the second spacer structure. In some implementations, the transfer of the pattern of the second spacer structure is by etching. The second spacer structure serves as a mask, and the areas of the substrate that are not covered by the second spacer structure are etched. The etchant used in the etching is characterized by a high etch selectivity between the second spacer structure and the substrate. In the example shown in FIG. 3F and FIG. 4F, the pattern of the second spacer structure 308 is transferred, and the concentric fins 102a and 102b, like the ones shown in FIG. 1, are formed.

It should be understood that the LFN transistor 100 is fabricated based on the method 200 for fabricating concentric fins shown in FIG. 2, and additional operations may be performed to fabricate other components of the LFN transistor 100. For example, the gate structures (e.g., the gate structures 126-1 and 126-2) may be fabricated.

The fabrication processes of the LFN transistor 100 are compatible with processes such as FinFET fabrication processes, and no complicated processes and circuit designs are needed. Extra ion implantation processes, extra masks, and complicated oxide engineering can be avoided as well. In addition, the LFN transistor 100 may be simultaneously formed on the same semiconductor chip along with other circuits formed on the semiconductor chip, such as digital circuitry, analog circuitry, and mixed signal circuitry, which are also formed using the same fabrication processes such as FinFET fabrication processes.

Non-Uniformity as an Additional Contributor to Low Frequency Noise

It has been observed that the non-uniformity of features of the fins that serve as channels also contributes to the low-frequency noise of an LFN transistor. The non-uniformity of the fin height, the fin width, the crystal plane, and the lattice transition are some examples. A feature or parameter is non-uniform when the maximum deviates from the minimum by above 5%. As mentioned above, the low-frequency noise results from the cumulative effect of a large number of traps that are distributed inside the oxide or at the silicon-oxide interface. The non-uniformity contributes to more traps located inside the oxide (i.e., the gate dielectric) or at the silicon-oxide interface. As a result, carriers in the curved channels (e.g., 125-1a, 125-1b, 125-2a, and 125-2b shown in FIG. 1) are more likely to be trapped or de-trapped due to these extra traps. Accordingly, the low-frequency noise generated by the LFN transistor is increased. In other words, the probability for the carriers to interact with the interface traps increases, thereby enhancing the noise level of the LFN transistor.

Figures 5A, 5B, 5C:
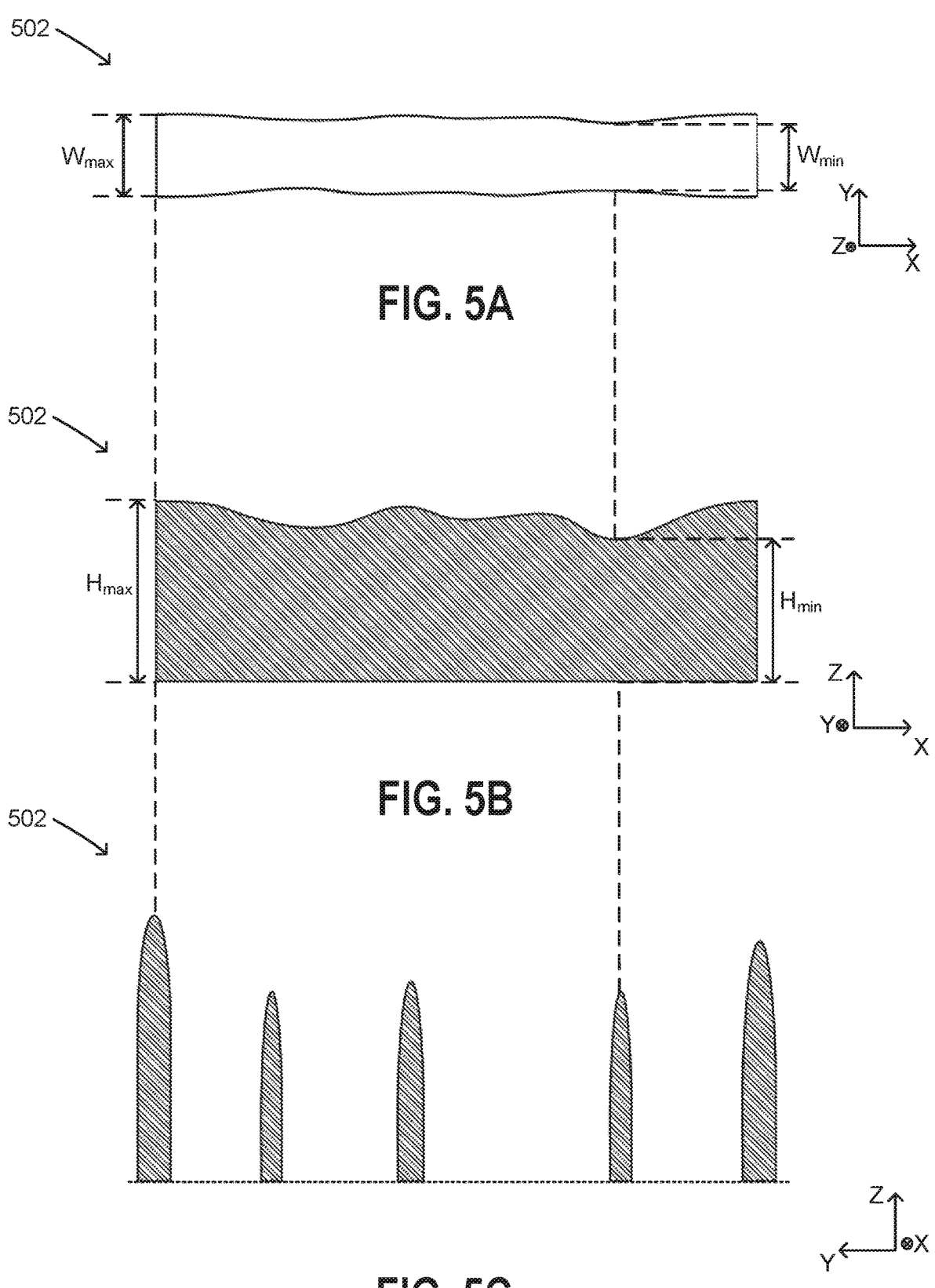
FIG. 5A is a diagram illustrating a top view of a portion of a fin in accordance with some embodiments.
FIG. 5B is a diagram illustrating a side view of the portion of the fin shown in FIG. 5A in accordance with some embodiments.
FIG. 5C is a diagram illustrating cross-sectional views of the portion of the fin shown in FIG. 5A in accordance with some embodiments.

FIG. 5A is a diagram illustrating a top view of a portion 502 of a fin in accordance with some embodiments. FIG. 5B is a diagram illustrating a side view of the portion 502 of the fin shown in FIG. 5A in accordance with some embodiments. FIG. 5C is a diagram illustrating cross-sectional views of the portion 502 of the fin shown in FIG. 5A in accordance with some embodiments.

In the example shown in FIG. 5A, the portion 502 of a fin (e.g., the fin 102a shown in FIG. 1) is illustrated as a straight portion extending in the X-direction. However, one of ordinary skill in the art would recognize that the techniques described herein are also applicable to curved portions (e.g., the curved channels 125-1a, 125-1b, 125-2a, and 125-2b shown in FIG. 1). In the example shown in FIG. 5A, the width of the portion 502 in the Y-direction varies. The maximum of the width of the portion 502 is $W_{max}$, while the minimum of the width of the portion 502 is $W_{min}$. In some embodiments, the width of the portion 502 in the Y-direction is non-uniform, i.e., the maximum of the width of the portion 502 deviates from the minimum of the width of the portion 502 by above 5%.

In the example shown in FIG. 5B, the height of the portion 502 in the Z-direction varies. The maximum of the height of the portion 502 is $H_{max}$, while the minimum of the height of the portion 502 is $H_{min}$. In some embodiments, the height of the portion 502 in the Z-direction is non-uniform, i.e., the maximum of the height of the portion 502 deviates from the minimum of the height of the portion 502 by above 5%.

In the example shown in FIG. 5C, the portion 502 has the largest height $H_{max}$ in the Z-direction where it has the largest width $W_{max}$ in the Y-direction, while the portion 502 has the smallest height $H_{min}$ in the Z-direction where it has the smallest width $W_{min}$ in the Y-direction.

In one implementation, the variation in the height of the portion 502 and the variation in the width of the portion 502 may be a result of the etching process. In other words, the normally unwanted non-uniformity can be utilized and turned into an additional contributor of the low-frequency noise.

Multiple Variations

The LFN transistor 100 shown in FIG. 1 is one example, and there are many variations, which will be described in detail with reference to FIGS. 6-14.

Figure 6:
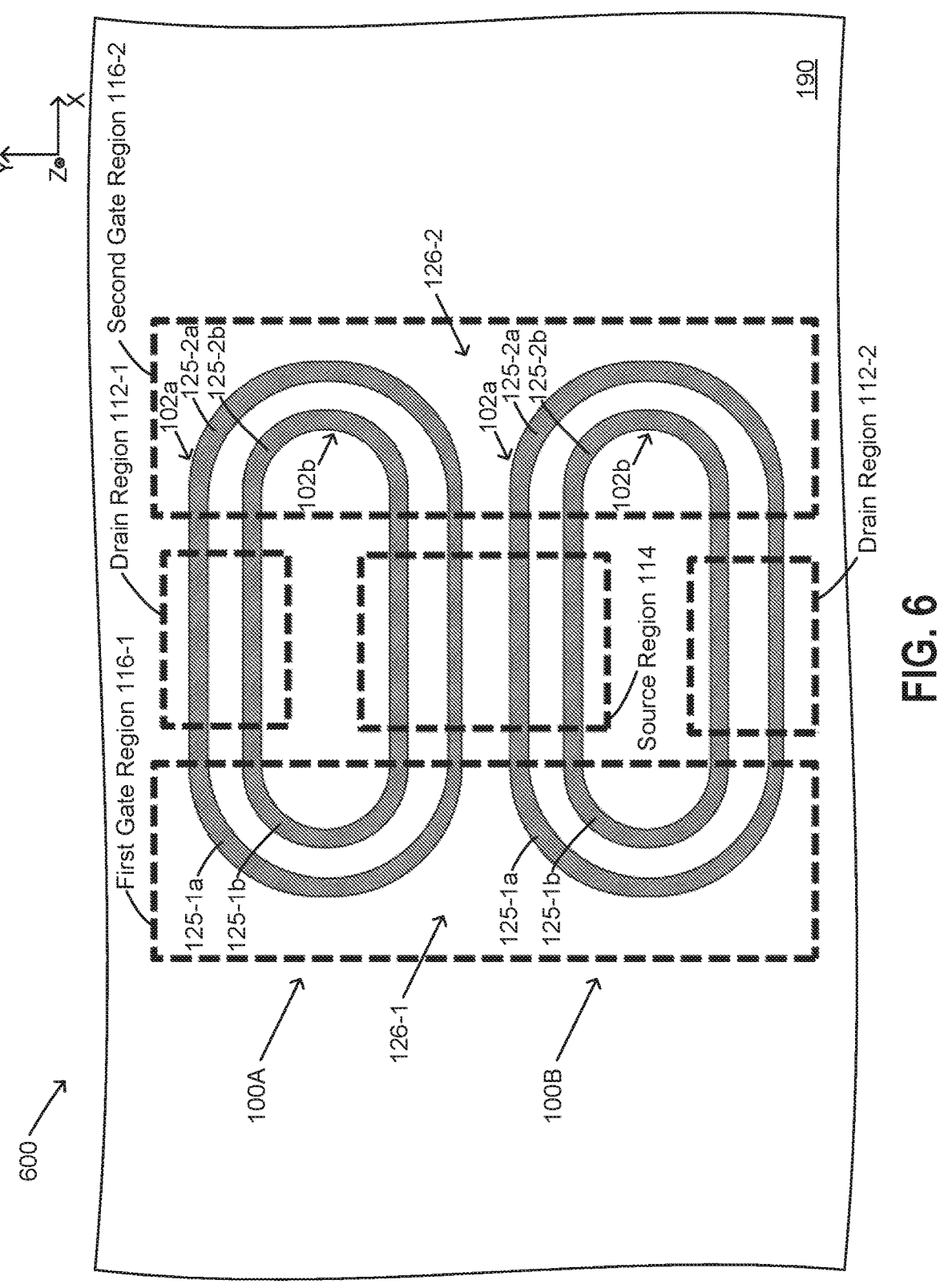
FIG. 6 is a diagram illustrating an example LFN transistor in accordance with some embodiments.

FIG. 6 is a diagram illustrating an example LFN transistor 600 in accordance with some embodiments. The LFN transistor 600 shown in FIG. 6 can be considered as two LFN transistors 100A and 100B, like the LFN transistor 100 shown in FIG. 1, connected together. Each of the LFN transistors 100A and 100B includes two concentric fins 102a and 102b protruding upwardly from a top surface of the substrate 190 in the Z-direction. And each of the LFN transistors 100A and 100B includes two pairs of curved channels 125-1a, 125-1b, 125-2a, and 125-2b.

The LFN transistor 600 includes a gate structure 126-1 located in the first gate region 116-1, and a gate structure 126-2 located in the second gate region 116-2. The gate structure 126-1 are shared by the LFN transistors 100A and 100B; the gate structure 126-2 are shared by the LFN transistors 100A and 100B. The LFN transistors 100A and 10B also share a source region 114.

Because of the presence of the curved channels 125-1a, 125-1b, 125-2a, and 125-2b, there are more traps located inside the oxide (i.e., the gate dielectric) or at the silicon-oxide interface. As a result, carriers in the curved channels 125-1a, 125-1b, 125-2a, and 125-2b are more likely to be trapped or de-trapped due to these extra traps. Accordingly, the low-frequency noise generated by the LFN transistor 600 is increased.

Figure 7:
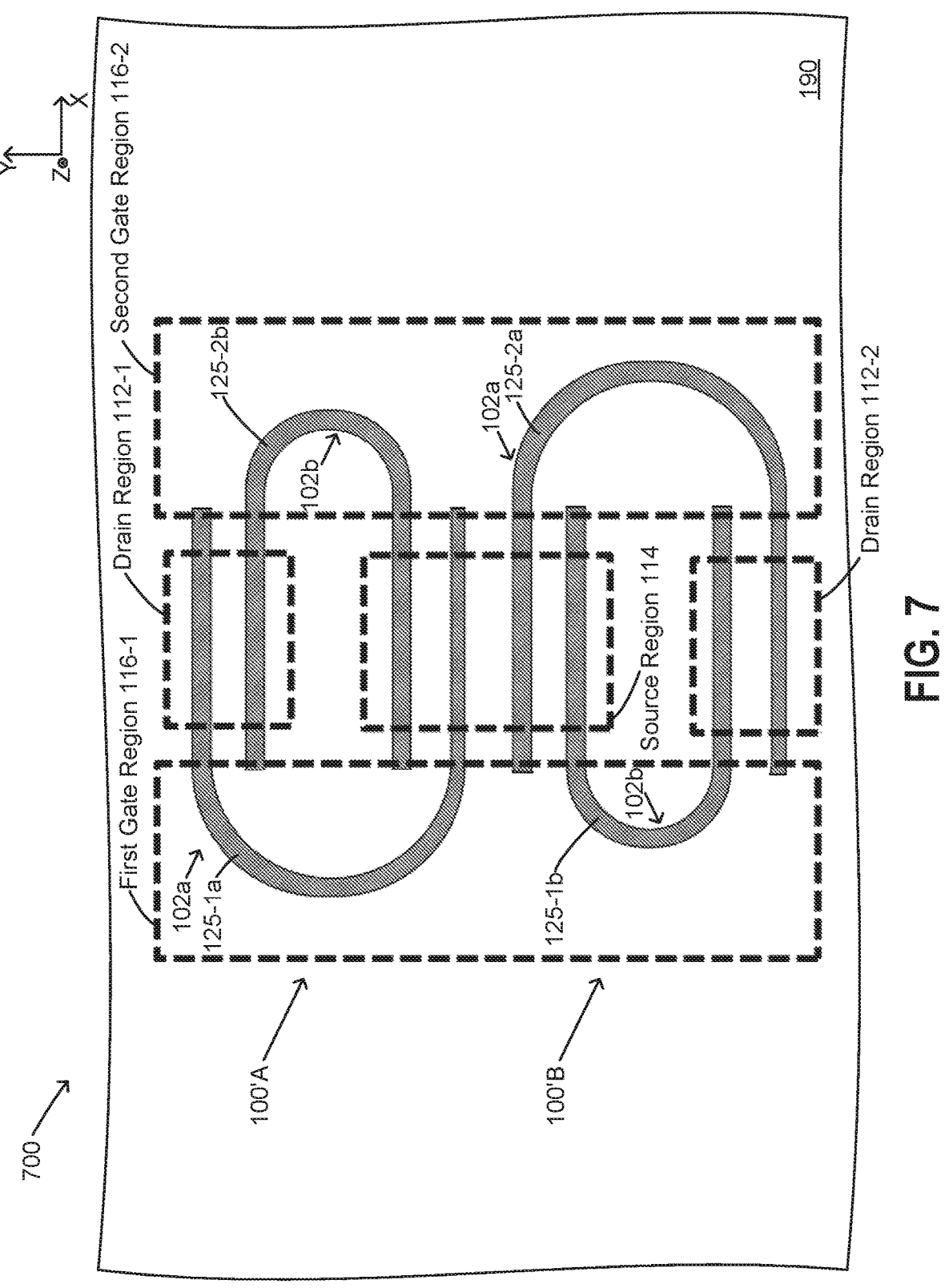
FIG. 7 is a diagram illustrating an example LFN transistor in accordance with some embodiments.

FIG. 7 is a diagram illustrating an example LFN transistor 700 in accordance with some embodiments. The LFN transistor 700 shown in FIG. 7 is similar to the LFN transistor 600 shown in FIG. 6. The LFN transistor 700 can be considered as two LFN transistors 100'A and 100'B connected together. Different from the LFN transistors 100A and 100B shown in FIG. 6, each of the LFN transistors 100'A and 100'B includes a portion of the two concentric fins 102a and 102b protruding upwardly from a top surface of the substrate 190 in the Z-direction.

Specifically, each of the LFN transistors 100'A and 100'B includes one curved channel 125-1a and 125-2b located in the first gate region 116-1 and the second gate region 116-2, respectively, instead of a pair of curved channels 125-1a and 125-1b and a pair of curved channels 125-2a and 125-2b located in the first gate region 116-1 and the second gate region 116-2, respectively, as shown in FIG. 6. The fins 102a and 102b of each of the LFN transistors 100'A and 100'B can be achieved by removing a portion of concentric fins 102a and 102b shown in FIG. 6.

Likewise, because of the presence of the curved channels 125-1a and 125-2b, there are more traps located inside the oxide (i.e., the gate dielectric) or at the silicon-oxide interface. As a result, carriers in the curved channels 125-1a and 125-2b are more likely to be trapped or de-trapped due to these extra traps. Accordingly, the low-frequency noise generated by the LFN transistor 700 is increased.

Figure 8:
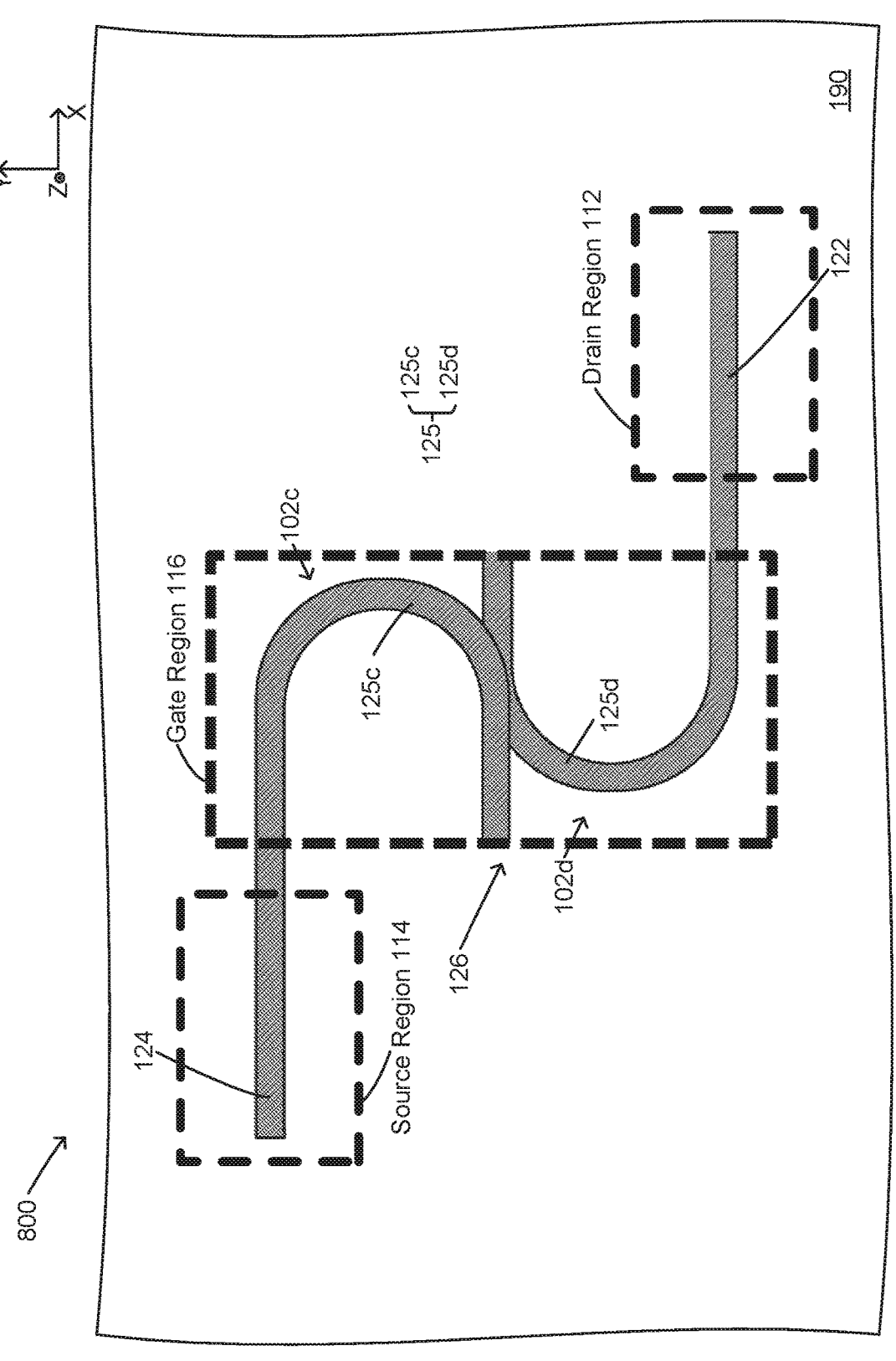
FIG. 8 is a diagram illustrating an example LFN transistor in accordance with some embodiments.

FIG. 8 is a diagram illustrating an example LFN transistor 800 in accordance with some embodiments. In the example shown in FIG. 8, the LFN transistor 800 includes, among other components, a substrate 190, a first curved fin 102c and a second curved fin 102d protruding upwardly from a top surface of the substrate 190 in the Z-direction, and a gate structure 126 located in a gate region 116. The first curved fin 102c and the second curved fin 102d are in contact with each other. The first curved fin 102c overlaps the second curved fin 102d. The first curved fin 102c includes a source 124 located in a source region 114 and a first curved channel section 125c; the second curved fin 102d includes a drain 122 located in a drain region 112 and a second curved channel section 125d. The first curved channel section 125c and the second curved channel section 125d are in contact with each other, thus forming a curved channel 125. The curved channel 125 is located between the source 124 and the drain 122 and serves as a channel for carriers to flow through it. Likewise, the gate structure 126 includes a gate dielectric and a gate electrode and is operable to control the on and off of the curved channel 125.

The first curved fin 102c and the second curved fin 102d can be considered as a portion of "paperclip-like fins." The source 124 is located at the elongated section of the first curved fin 102c; the first curved channel section 125c is located at the round corner section of the first curved fin 102c. The drain 122 is located at the elongated section of the second curved fin 102d; the second curved channel section 125d is located at the round corner section of the second curved fin 102d.

Likewise, because of the presence of the curved channel sections 125c and 125d, there are more traps located inside the oxide (i.e., the gate dielectric) or at the silicon-oxide interface. As a result, carriers in the curved channel 125 are more likely to be trapped or de-trapped due to these extra traps. Accordingly, the low-frequency noise generated by the LFN transistor 800 is increased.

FIGS. 9A-9E are top views of the structure at various stages in accordance with some embodiments. In the example shown in FIG. 9A, a ground pattern 902 is formed. In one implementation, the ground pattern 902 is formed by patterning and etching the (silicon) substrate. Therefore, the ground pattern 902 is made of the same material (e.g., silicon) as the substrate. The ground pattern 902 includes a first ground pattern section 902c and a second ground pattern section 902d arranged in the manner shown in FIG. 9A. Each of the first ground pattern section 902c and the second ground pattern section 902d has a rectangular shape extending in the X-direction with round corners. In some embodiments, the round corners are naturally formed during the etching process.

Figures 9A, 9B, 9C, 9D, 9E:
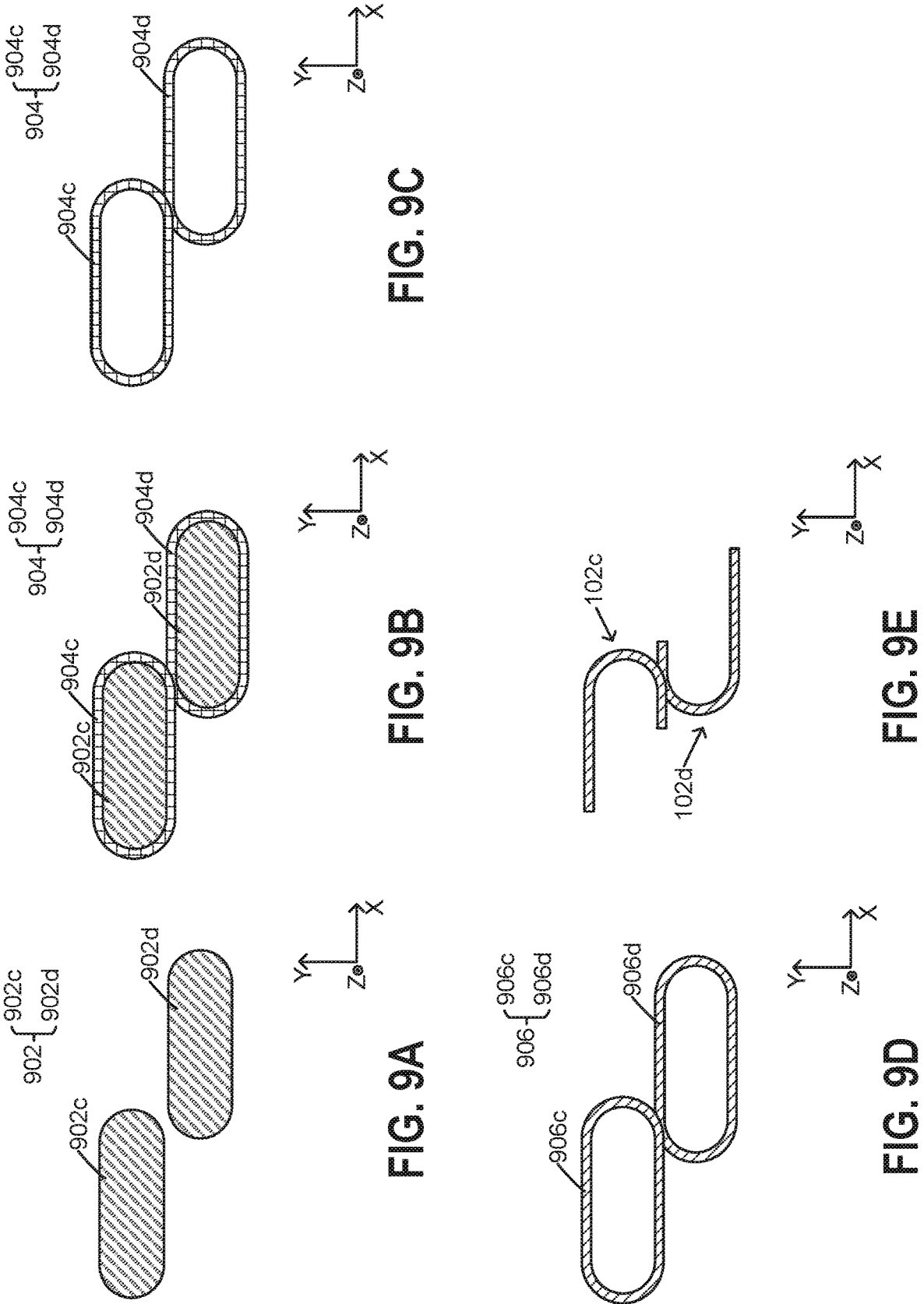
FIGS. 9A-9E are top views of the structure at various stages in accordance with some embodiments.

In the example shown in FIG. 9B, a spacer structure 904 is formed around the ground pattern 902. In some implementations, the spacer structure 904 is formed by the blanket deposition of a spacer layer and subsequent etching. In some examples, the spacer structure 904 is made of silicon nitride. In other examples, the spacer structure 904 is made of silicon dioxide. In yet other examples, the spacer structure 904 is made of titanium oxide. It should be understood that the spacer structure 904 can be made of other suitable materials in other embodiments. The spacer structure 904 includes a first spacer section 904c around the first ground pattern section 902c and a second spacer section 904d around the second ground pattern section 902d. In the example shown in FIG. 9B, the distance between the first ground pattern section 902c and the second ground pattern section 902d is chosen such that the first spacer section 904c and the second spacer section 904d are in contact with each other (i.e., the first spacer section 904c overlaps the second spacer section 904d).

In the example shown in FIG. 9C, the ground pattern 902 is removed. In some implementations, the ground pattern 902 is removed by etching. The etchant used in the etching is characterized by a high etch selectivity between the ground pattern 902 and the spacer structure 904. In the example shown in FIG. 9C, the ground pattern 902 is removed, and the portion of the substrate that is not covered by the spacer structure 904 is etched in the Z-direction. In some embodiments, a protrusion structure is formed, and it is located under the spacer structure 904.

In the example shown in FIG. 9D, a complete fin structure 906 is formed by transferring the pattern of the spacer structure 904. In some implementations, the transfer of the pattern of the spacer structure 904 is by etching. The spacer structure 904 serves as a mask, and the areas of the substrate that are not covered by the spacer structure 904 are etched. The etchant used in the etching is characterized by a high etch selectivity between the spacer structure 904 and the substrate. In the example shown in FIG. 9D, after the pattern of the spacer structure 904 is transferred, and a complete fin structure 906 is formed. The complete fin structure 906 includes a first complete fin section 906c and a second complete fin section 906d.

In the example shown in FIG. 9E, a portion of the complete fin structure 906 is removed. In some implementations, a portion of the complete fin structure 906 is removed by etching the exposed area. After a portion of the complete fin structure 906 is removed, a first curved fin 102c and a second curved fin 102d are formed.

Figure 10:
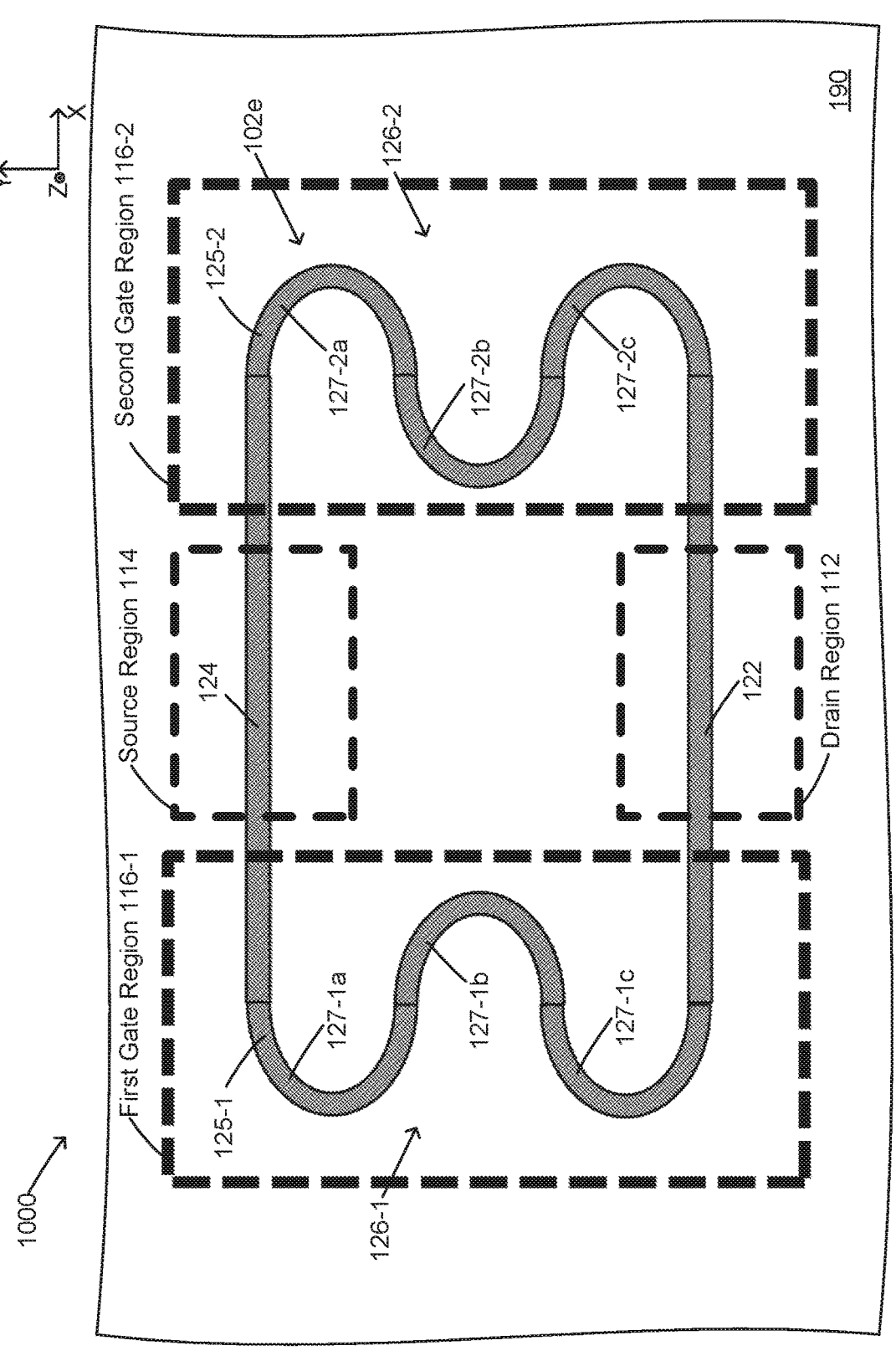
FIG. 10 is a diagram illustrating an example LFN transistor in accordance with some embodiments.

FIG. 10 is a diagram illustrating an example LFN transistor 1000 in accordance with some embodiments. In the example shown in FIG. 10, the LFN transistor 1000 includes, among other components, a substrate 190, a curved fin 102e protruding upwardly from a top surface of the substrate 190 in the Z-direction, a gate structure 126-1 located in the first gate region 116-1, and a gate structure 126-2 located in the second gate region 116-2. The curved fin 102e further includes a drain 122 located in a drain region 112, a source 124 located in a source region 114, a first curved channel 125-1 located in a first gate region 116-1, and a second curved channel 125-2 located in a second gate region 116-2.

The LFN transistor 1000 has a double-gate configuration, and the first curved channel 125-1 and the second curved channel 125-2 are located between the drain 122 and the source 124. Each of the gate structures 126-1 and 126-2 includes a gate dielectric and a gate electrode. The gate dielectrics are disposed on (e.g., in contact with three sides) the first curved channel 125-1 and the second curved channel 125-2, respectively. And the gate electrodes are disposed on (e.g., in contact with three sides) the gate dielectrics, respectively. The gate structures 126-1 and 126-2 are operable to control the on and off of the first curved channel 125-1 and the second curved channel 125-2, respectively.

In the example shown in FIG. 10, the drain 122 and the source 124 are located at the elongated section of the curved fin 102e. The first curved channel 125-1 is located on the left side, while the second curved channel 125-2 is located on the right side. In other words, the drain 122 and the source 124 are located at straight sections of the curved fin 102e, whereas the curved channels 125-1 and 125-2 are located at non-straight or curved sections of the curved fin 102e.

In the example shown in FIG. 10, the first curved channel 125-1 includes three round corner sections 127-1a, 127-1b, and 127-1c connected in series, and the second curved channel 125-2 includes three round corner sections 127-2a, 127-2b, and 127-2c connected in series. While each of the first curved channel 125-1 and the second curved channel 125-2 includes three round corner sections, it should be understood each of them may include more or fewer round corner sections. In one embodiment, each of the first curved channel 125-1 and the second curved channel 125-2 includes an odd number of round corner sections, and the odd number is larger than three. In one example, each of the first curved channel 125-1 and the second curved channel 125-2 includes five round corner sections. In another example, each of the first curved channel 125-1 and the second curved channel 125-2 includes seven round corner sections. One of ordinary skill in the art would recognize many variations, modifications, and alternatives.

Likewise, because of the presence of the first curved channel 125-1 and the second curved channel 125-2, there are more traps located inside the oxide (i.e., the gate dielectric) or at the silicon-oxide interface. As a result, carriers in the first curved channel 125-1 and the second curved channel 125-2 are more likely to be trapped or de-trapped due to these extra traps. Accordingly, the low-frequency noise generated by the LFN transistor 1000 is increased.

FIGS. 11A-11E are top views of the structure at various stages in accordance with some embodiments. In the example shown in FIG. 11A, a ground pattern 1102 is formed. In one implementation, the ground pattern 1102 is formed by patterning and etching the (silicon) substrate. Therefore, the ground pattern 1102 is made of the same material (e.g., silicon) as the substrate. The ground pattern 1102 includes a first ground pattern section 1102e, a second ground pattern section 1102f, a third ground pattern section 1102g, and a fourth ground pattern section 1102h arranged in the manner shown in FIG. 11A. Each of the first ground pattern section 1102e, the second ground pattern section 1102f, the third ground pattern section 1102g, and the fourth ground pattern section 1102h has a rectangular shape extending in the X-direction with round corners. In some embodiments, the round corners are naturally formed during the etching process.

Figures 11A, 11B, 11C, 11D, 11E:
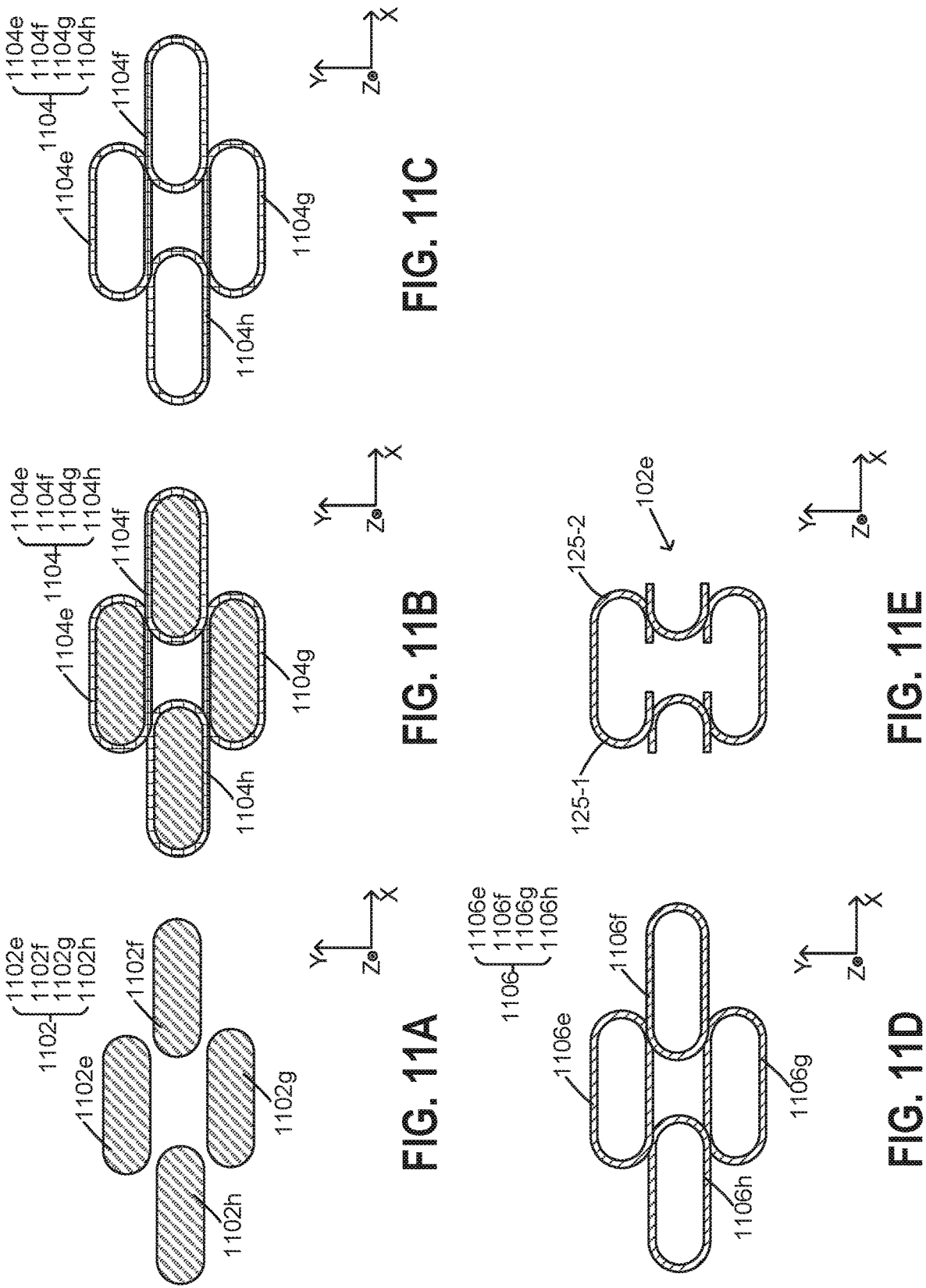
FIGS. 11A-11E are top views of the structure at various stages in accordance with some embodiments.

In the example shown in FIG. 11B, a spacer structure 1104 is formed around the ground pattern 1102. In some implementations, the spacer structure 1104 is formed by the blanket deposition of a spacer layer and subsequent etching. In some examples, the spacer structure 1104 is made of silicon nitride. In other examples, the spacer structure 1104 is made of silicon dioxide. In yet other examples, the spacer structure 1104 is made of titanium oxide. It should be understood that the spacer structure 1104 can be made of other suitable materials in other embodiments. The spacer structure 1104 includes a first spacer section 1104e around the first ground pattern section 1102e, a second spacer section 1104f around the second ground pattern section 1102f, a third spacer section 1104g around the third ground pattern section 1102g, and a fourth spacer section 1104h around the fourth ground pattern section 1102h. In the example shown in FIG. 11B, the distance among the first ground pattern section 1102e, the second ground pattern section 1102f, the third ground pattern section 1102g, and the fourth ground pattern section 1102h is chosen such that the neighboring spacer sections are in contact with each other (i.e., overlap with each other).

In the example shown in FIG. 11C, the ground pattern 1102 is removed. In some implementations, the ground pattern 1102 is removed by etching. The etchant used in the etching is characterized by a high etch selectivity between the ground pattern 1102 and the spacer structure 1104. In the example shown in FIG. 11C, the ground pattern 1102 is removed, and the portion of the substrate that is not covered by the spacer structure 1104 is etched in the Z-direction. In some embodiments, a protrusion structure is formed, and it is located under the spacer structure 1104.

In the example shown in FIG. 11D, a complete fin structure 1106 is formed by transferring the pattern of the spacer structure 1104. In some implementations, the transfer of the pattern of the spacer structure 1104 is by etching. The spacer structure 1104 serves as a mask, and the areas of the substrate that are not covered by the spacer structure 1104 are etched. The etchant used in the etching is characterized by a high etch selectivity between the spacer structure 1104 and the substrate. In the example shown in FIG. 11D, after the pattern of the spacer structure 1104 is transferred, and a complete fin structure 1106 is formed. The complete fin structure 1106 includes a first complete fin section 1106e, a second complete fin section 1106f, a third complete fin section 1106g, and a fourth complete fin section 1106h.

In the example shown in FIG. 11E, a portion of the complete fin structure 1106 is removed. In some implementations, a portion of the complete fin structure 1106 is removed by etching the exposed area. After a portion of the complete fin structure 1106 is removed, the curved fin 102e is formed, and the curved fin 102e includes, among other components, the first curved channel 125-1 and the second curved channel 125-2.

Figure 12:
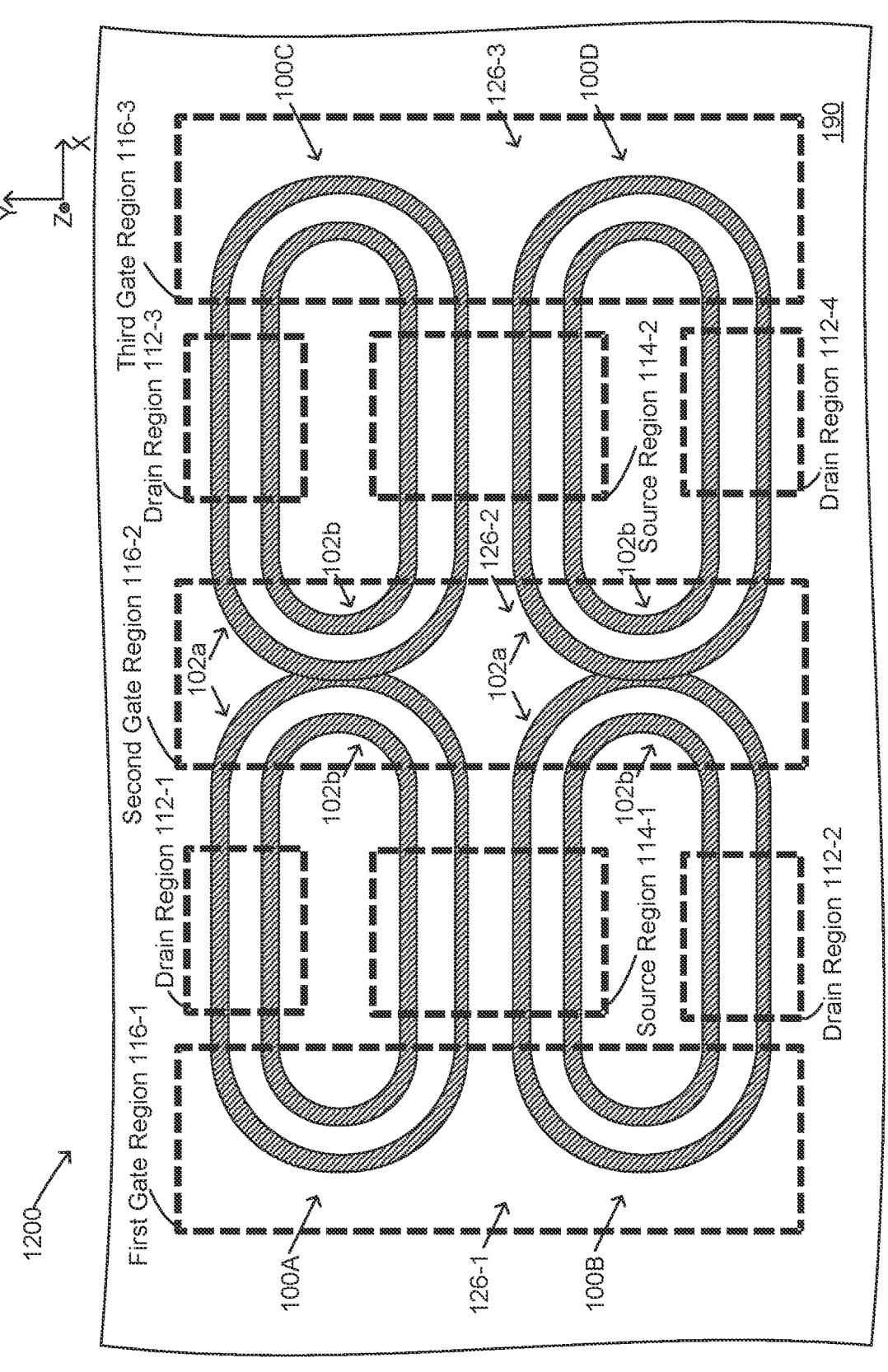
FIG. 12 is a diagram illustrating an example LFN transistor in accordance with some embodiments.

FIG. 12 is a diagram illustrating an example LFN transistor 1200 in accordance with some embodiments. The LFN transistor 1200 shown in FIG. 12 can be considered as four LFN transistors 100A, 100B, 100C and 100D, like the LFN transistor 100 shown in FIG. 1, connected together. The LFN transistor 1200 shown in FIG. 12 can also be considered as a combination of two LFN transistors 600 shown in FIG. 6 connected together.

Each of the LFN transistors 100A, 100B, 100C, and 100D includes two concentric fins 102a and 102b protruding upwardly from a top surface of the substrate 190 in the Z-direction. And each of the LFN transistors 100A, 100B, 100C, and 100D includes two pairs of curved channels.

The LFN transistor 1200 includes a gate structure 126-1 located in the first gate region 116-1, a gate structure 126-2 located in the second gate region 116-2, and a gate structure 126-3 located in the third gate region 116-3. The gate structure 126-1 are shared by the LFN transistors 100A and 100B; the gate structure 126-2 are shared by the LFN transistors 100A, 100B, 100C, and 100D; the gate structure 126-3 are shared by the LFN transistors 100C and 100D. The LFN transistors 100A and 100B also share a source region 114-1; the LFN transistors 100C and 100D also share a source region 114-2.

Likewise, because of the presence of the curved channels, there are more traps located inside the oxide (i.e., the gate dielectric) or at the silicon-oxide interface. As a result, carriers in the curved channels are more likely to be trapped or de-trapped due to these extra traps. Accordingly, the low-frequency noise generated by the LFN transistor 1200 is increased.

Figure 13:
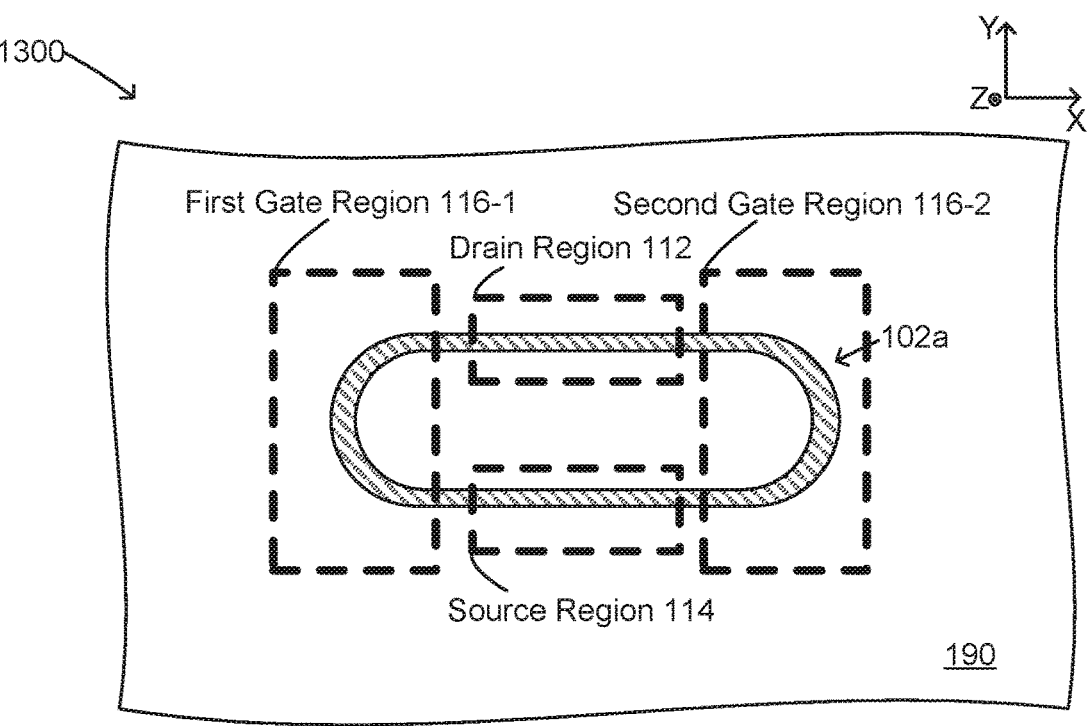
FIG. 13 is a diagram illustrating an example LFN transistor in accordance with some embodiments.
Figure 14:
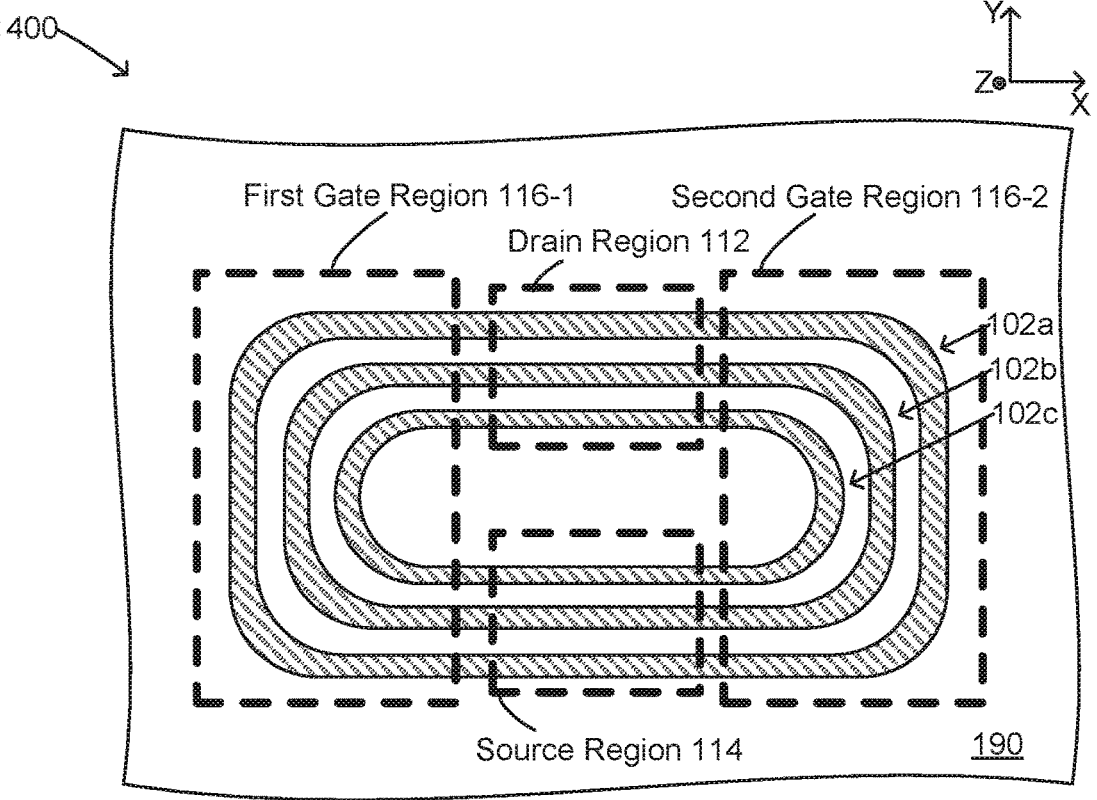
FIG. 14 is a diagram illustrating an example LFN transistor in accordance with some embodiments.

FIG. 13 is a diagram illustrating an example LFN transistor 1300 in accordance with some embodiments. FIG. 14 is a diagram illustrating an example LFN transistor 1400 in accordance with some embodiments. The LFN transistor 1300 shown in FIG. 13 is similar to the LFN transistor 100 shown in FIG. 1, except that the LFN transistor 1300 includes one fin 102a, instead of two concentric fins. Likewise, the LFN transistor 1400 shown in FIG. 14 is similar to the LFN transistor 100 shown in FIG. 1, except that the LFN transistor 1400 includes three concentric fins 102a, 102b, and 102c, instead of two concentric fins.

The single fin 102a shown in FIG. 13 can be achieved using a single-spacer process, like the one shown in FIGS. 9A-9D. The three concentric fins 102a, 102b, and 102c shown in FIG. 14 can be achieved using a triple-spacer process, which can be the process shown in FIGS. 3A-3E with an additional spacer process. It should be understood that more than three concentric fins can be employed in other embodiments as needed. One of ordinary skill in the art would recognize many variations, modifications, and alternatives.

Example Applications of LFN Transistors

Figure 15:
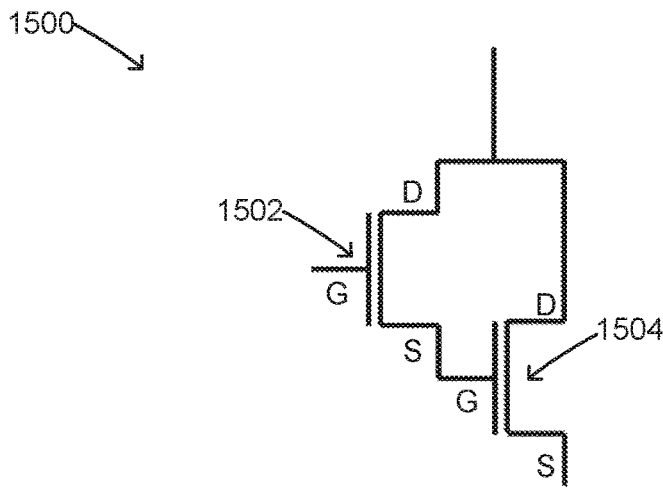
FIG. 15 is a diagram illustrating example cascaded LFN transistors in accordance with some embodiments.

FIG. 15 is a diagram illustrating example cascaded LFN transistors 1502 and 1504 in accordance with some embodiments. In the example shown in FIG. 15, two LFN transistors 1502 and 1504 are cascaded to form a noise source 1500. The source (S) of the LFN transistor 1502 is electrically connected to the gate (G) of the LFN transistor 1504, and the drain (D) of the LFN transistor 1502 and the drain (D) of the LFN transistor 1504 are electrically connected. The input terminal of the noise source 1500 is the gate (G) of the LFN transistor 1502.

The LFN transistor 1502 may be any of the example LFN transistors 100, 600, 700, 800, 1000, 1200, 1300, and 1400 discussed above or other variations thereof. Likewise, the LFN transistor 1504 may be any of the example LFN transistors 100, 600, 700, 800, 1000, 1200, 1300, and 1400 discussed above or other variations thereof. As explained above, due to the presence of curved channels and potentially the non-uniformity of features of the fins in some embodiments, there are more traps located inside the oxide (i.e., the gate dielectric) or at the silicon-oxide interface. As a result, carriers in the curved channels of the LFN transistors 1502 and 1504 are more likely to be trapped or de-trapped due to these extra traps. Accordingly, the low-frequency noise generated by the LFN transistors 1502 and 1504 is enhanced.

As a result, the drain current of the LFN transistor 1502, as an output in response to the input at the gate (G) of the LFN transistor 1502, has a relatively high low-frequency noise compared to transistors without curved channels. The output (i.e., the drain current) of the LFN transistor 1502 is used as the input of the LFN transistor 1504 as the source (S) of the LFN transistor 1502 is electrically connected to the gate (G) of the LFN transistor 1504, the drain current of the LFN transistor 1504, as an output in response to the input at the gate (G) of the LFN transistor 1504, has a further higher low-frequency noise compared to transistors without curved channels.

While two LFN transistors 1502 and 1504 are cascaded in the example shown in FIG. 15, it should be understood that more than two LFN transistors (e.g., three LFN transistors) can be cascaded to form a noise source. One of ordinary skill in the art would recognize many variations, modifications, and alternatives.

Figure 16:
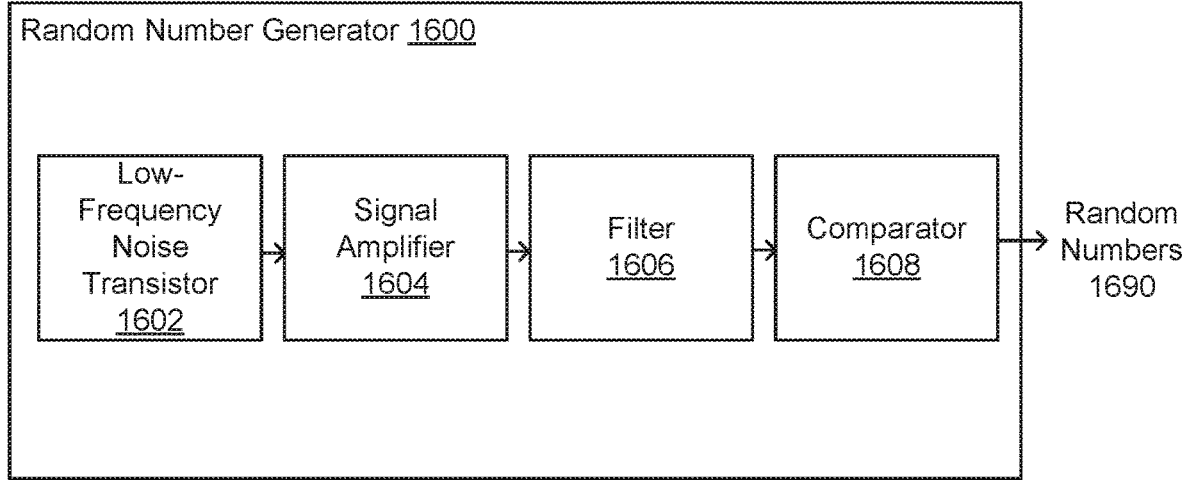
FIG. 16 is a diagram illustrating an example random number generator in accordance with some embodiments.

FIG. 16 is a diagram illustrating an example random number generator 1600 in accordance with some embodiments. A random number generator is used for random number generation, a process by which a sequence of numbers or symbols that cannot be reasonably predicted better than by random chance is generated. Thus, the particular outcome sequence will contain some patterns detectable in hindsight but unpredictable to foresight.

In the example shown in FIG. 16, the random number generator 1600 includes, among other components, an LFN transistor 1602, a signal amplifier, a filter, and a comparator. The LFN transistor 1602 serves as the noise source of the random number generator 1600 and may be any of the example LFN transistors 100, 600, 700, 800, 1000, 1200, 1300, and 1400, the noise source 1500 discussed above or other variations thereof.

The signal amplifier 1604 is configured to amplify the output signal of the LFN transistor 1602, which is an attribute that is constantly changing in a manner that is practically impossible to model. The filter 1606 is configured to receive the amplified output signal of the LFN transistor 1602 and filter out components not in the intended pass band (e.g., components with a frequency above a certain frequency). The comparator 1608 is configured to receive the filtered output signal of the LFN transistor 1602 and compare it to a reference signal. Based on the result of the comparison, random numbers 1690 are generated accordingly. It should be understood that the LFN transistor 1602 may be employed, as a noise source, in other random number generators having other architectures.

In another non-limiting example, the LFN transistors discussed above can be used, as a noise source, in a stochastic neural network. Stochastic neural networks originating from Sherrington-Kirkpatrick models are a type of artificial neural network built by introducing random variations into the network, either by giving the network's artificial neurons stochastic transfer functions, or by giving them stochastic weights. This makes them useful tools for optimization problems, as the random fluctuations help the network escape from local minima.

While some exemplary applications are discussed, it should be understood that the LFN transistors discussed above are generally applicable to neuromorphic computation, perturbative learning in bio-inspired computations, data encryption, probabilistic modeling, and other suitable high noise applications.

Summary

In accordance with some aspects of the disclosure, a transistor is provided. The transistor includes: a substrate; a first fin and a second fin protruding upwardly from a top surface of the substrate, wherein the first fin and the second fin are concentric, and each of the first fin and the second fin comprises a first straight section, a second straight section in parallel with the first straight section, a first curved section, and a second curved section; a first drain and a second drain located at the first straight section of the first fin and the first straight section of the second fin, respectively; a first source and a second source located at the second straight section of the first fin and the second straight section of the second fin, respectively; a first curved channel and a second curved channel located at the first curved section of the first fin and the first curved section of the second fin, respectively; and a third curved channel and a fourth curved channel located at the second curved section of the first fin and the second curved section of the second fin, respectively.

In accordance with some aspects of the disclosure, a method is provided. The method includes the following steps: forming a first ground pattern on a substrate, the first ground pattern having a rectangular shape extending in first horizontal direction with four round corners; forming a first spacer structure around the first ground pattern; removing the first ground pattern; forming a second spacer structure around the first spacer structure; removing the first spacer structure; and forming a first fin and a second fin by transferring a pattern of the second spacer structure, wherein the first fin and the second fin are concentric.

In accordance with some aspects of the disclosure, a transistor is provided. The transistor includes: a substrate; at least one fin protruding upwardly from a top surface of the substrate, wherein the at least one fin comprises at least one curved section; at least one drain located at the at least one fin; at least one source located at the at least one fin; and at least one curved channel located at the at least one curved section of the at least one fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:

a substrate;

a first fin and a second fin protruding upwardly from a top surface of the substrate, wherein the first fin and the second fin are concentric, and each of the first fin and the second fin comprises a first straight section, a second straight section in parallel with the first straight section, a first curved section, and a second curved section;

a first drain and a second drain located at the first straight section of the first fin and the first straight section of the second fin, respectively;

a first source and a second source located at the second straight section of the first fin and the second straight section of the second fin, respectively;

a first curved channel and a second curved channel located at the first curved section of the first fin and the first curved section of the second fin, respectively; and a third curved channel and a fourth curved channel located at the second curved section of the first fin and the second curved section of the second fin, respectively.

2. The transistor of claim 1, wherein the first curved section and the second curved section of the first fin are round corner sections.

3. The transistor of claim 2, wherein the first curved section and the second curved section of the second fin are round corner sections.

4. The transistor of claim 1, wherein the first curved channel and the second curved channel are located in a first gate region and controlled by a first gate structure.

5. The transistor of claim 4, wherein the third curved channel and the fourth curved channel are located in a second gate region and controlled by a second gate structure.

6. The transistor of claim 1, wherein the first curved section of the first fin is characterized by that a maximum fin height of the first curved section of the first fin deviates a minimum fin height of the first curved section of the first fin by above 5%.

7. The transistor of claim 1, wherein the first curved section of the first fin is characterized by that a maximum fin width of the first curved section of the first fin deviates a minimum fin width of the first curved section of the first fin by above 5%.

8. The transistor of claim 1, wherein the first curved section of the first fin is characterized by that a maximum fin height of the first curved section of the first fin deviates a minimum fin height of the first curved section of the first fin by above 5%, a maximum fin width of the first curved section of the first fin deviates a minimum fin width of the first curved section of the first fin by above 5%.

9. The transistor of claim 1, wherein the first drain and the second drain are connected to a source contact, and wherein the first source and the second source are connected to a source contact.

10. A transistor comprising:

a substrate;

at least one fin protruding upwardly from a top surface of the substrate, wherein the at least one fin comprises a first fin and a second fin, wherein the first fin and the second fin are concentric, and each of the first fin and the second fin comprises a first straight section, a second straight section in parallel with the first straight section, a first curved section, and a second curved section;

at least one drain located at the first fin or the second fin;

at least one source located at the first fin or the second fin; and at least one curved channel located at the first curved section or the second curved section of the first fin or the second fin.

11. The transistor of claim 10, wherein the first curved section of the first fin is characterized by that a maximum fin height of the first curved section deviates a minimum fin height of the first curved section by above 5%.

12. The transistor of claim 10, wherein the first curved section of the first fin is characterized by that a maximum fin width of the first curved section deviates a minimum fin width of the first curved section by above 5%.

13. A method comprising:

forming a substrate;

forming a first fin and a second fin protruding upwardly from a top surface of the substrate, wherein the first fin and the second fin are concentric, and each of the first fin and the second fin comprises a first straight section, a second straight section in parallel with the first straight section, a first curved section, and a second curved section;

forming a first drain and a second drain located at the first straight section of the first fin and the first straight section of the second fin, respectively;

forming a first source and a second source located at the second straight section of the first fin and the second straight section of the second fin, respectively;

forming a first curved channel and a second curved channel located at the first curved section of the first fin and the first curved section of the second fin, respectively; and forming a third curved channel and a fourth curved channel located at the second curved section of the first fin and the second curved section of the second fin, respectively.

14. The method of claim 13, wherein the first curved section and the second curved section of the first fin are round corner sections.

15. The method of claim 14, wherein the first curved section and the second curved section of the second fin are round corner sections.

16. The method of claim 13, wherein the first curved channel and the second curved channel are located in a first gate region and controlled by a first gate structure.

17. The method of claim 16, wherein the third curved channel and the fourth curved channel are located in a second gate region and controlled by a second gate structure.

18. The method of claim 13, wherein the first curved section of the first fin is characterized by that a maximum fin height of the first curved section of the first fin deviates a minimum fin height of the first curved section of the first fin by above 5%.

19. The method of claim 13, wherein the first curved section of the first fin is characterized by that a maximum fin width of the first curved section of the first fin deviates a minimum fin width of the first curved section of the first fin by above 5%.

* * * * *